(12) United States Patent
Kuibira et al.

(10) Patent No.: US 6,460,482 B1
(45) Date of Patent: Oct. 8, 2002

(54) GAS SHOWER UNIT FOR SEMICONDUCTOR MANUFACTURING APPARATUS AND SEMICONDUCTOR MANUFACTURING APPARATUS

(75) Inventors: Akira Kuibira; Hirohiko Nakata, both of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 29 days.

(21) Appl. No.: 09/690,865

(22) Filed: Oct. 17, 2000

(30) Foreign Application Priority Data

Jan. 20, 2000  (JP) .......................... 2000/011862
May 30, 2000  (JP) .......................... 2000/160722

(51) Int. Cl.⁷ ........................... C23C 16/00; H05H 1/00
(52) U.S. Cl. ............... 118/723 R; 118/723 E; 156/345.34; 156/345.35; 156/345.47
(58) Field of Search ............ 118/723 R, 723 E, 118/723 ER; 156/345.34, 345.35, 345.47

(56) References Cited

U.S. PATENT DOCUMENTS 5,680,013 A  * 10/1997  Dornfest et al. ........ 315/111.21
5,716,451 A  * 2/1998  Hama et al. ............... 118/723 I
6,089,182 A  * 7/2000  Hama ....................... 118/723 I

FOREIGN PATENT DOCUMENTS

| JP | 1-180982 A | * 7/1989 | ............ C23C/16/50 |
| JP | 7-273052 A | * 10/1995 | ......... H01L/21/205 |
| JP | 7-273101 A | * 10/1995 | ........... H01L/21/31 |
| JP | 8-188495 | 7/1996 | |
| JP | 10-144498 A | * 5/1998 | ............ H05H/1/46 |

* cited by examiner

Primary Examiner—Gregory Mills
Assistant Examiner—P. Hassanzadeh
(74) Attorney, Agent, or Firm—W. F. Fasse; W. G. Fasse

(57) ABSTRACT

A gas shower unit has a function of preliminary heating reactant gas to be passed therethrough, and is thus capable of causing uniform reaction within a semiconductor manufacturing apparatus and preventing through hole clogging and particle generation. The gas shower unit has a base material of 5 mm or less in thickness and includes a sintered aluminum nitride base material having a plurality of through holes and a heater circuit pattern or a plasma upper electrode as a conductive layer formed in the sintered aluminum nitride base material.

37 Claims, 10 Drawing Sheets

GAS SHOWER UNIT FOR SEMICONDUCTOR MANUFACTURING APPARATUS AND SEMICONDUCTOR MANUFACTURING APPARATUS

BACKGROUND OF THE INVENTION

1. Field of the Invention

The present invention relates to a gas shower unit for a semiconductor manufacturing apparatus. In particular, the invention relates to a gas shower unit used in a semiconductor manufacturing apparatus such as CVD apparatus, plasma CVD apparatus, etching apparatus and plasma etching apparatus for the purpose of uniformly supplying reactant gas to a semiconductor wafer.

2. Description of the Background Art

For etching of a semiconductor wafer surface or depositing of a film thereon, a method has been employed according to which gas for etching or for film deposition is supplied by means of batch processing to a large number of wafers held on racks, and then the wafers are heated as required from the outer periphery (hot wall method).

However, as requirements become severer for higher integration and speed of semiconductor devices, a problem arises of non-uniform etching and unequal quality of completed films due to difference in temperature and gas flow depending on the location in a semiconductor manufacturing apparatus. Then, another type of semiconductor manufacturing apparatus has gradually been used instead that employs single wafer processing in which a plurality of etching apparatuses and film deposition apparatuses are arranged side by side and wafers are transported automatically by a loader through the apparatuses where the wafers are processed one by one.

In the semiconductor manufacturing apparatus employing the single wafer processing, a semiconductor wafer is placed on the surface of a holder made of ceramics or metal. The wafer is secured onto the holder surface statically, mechanically, or by applying voltage to an electrode provided in the holder so as to fasten the wafer by an electrostatic force. The surface temperature of the semiconductor wafer held on the holder is precisely controlled in order to adjust the film deposition rate or etching rate in the process of CVD (Chemical Vapor Deposition), plasma CVD, etching, plasma etching or the like. For this temperature control, the wafer holder has a heater therein to heat the outermost surface of the holder and accordingly heat the semiconductor wafer by heat transfer. In order to cut the manufacturing cost of semiconductor devices, an attempt is made to increase the diameter of a semiconductor wafer and thus increase the number of semiconductor chips produced from one wafer. If the diameter of the semiconductor wafer is increased, it is more severely required to uniformly heat the outermost surface of the wafer holder in order to avoid different reaction environments in etching or film deposition within a semiconductor manufacturing apparatus.

Further, if reactant gas is merely supplied through a pipe attached to a chamber of the semiconductor manufacturing apparatus, gas does not uniformly flow through respective regions where the gas is directly and indirectly supplied respectively. As a result, the reactant gas has different concentrations on the surface of a semiconductor wafer. Control accordingly becomes difficult for realizing uniform etching or film deposition on the surface of the semiconductor wafer. Then, for the purpose of uniformly supplying gas onto the semiconductor wafer and thus maintaining a constant concentration of the reactant gas, a method is employed according to which a gas shower unit is positioned directly above the semiconductor wafer, the shower unit being formed of a sheetlike base material with a large number of through holes formed therein. This method enables gas to blow out as if from a showerhead, and consequently the gas concentration can be made as constant as possible on the semiconductor wafer surface.

The temperature at which the gas is caused to react is different depending on the type of reactant gas. Approximately, the temperature is 100 to 400° C. for high-temperature etching, 200 to 500° C., for plasma CVD and 400 to 800° C. for CVD.

Usually the wafer holder has a heater therein to directly heat a wafer and adjust temperature to the one required for reaction. If a reactant gas at room temperature is directly supplied from the gas shower unit, the reactant gas is suddenly heated on the wafer and accordingly the wafer temperature is decreased. Therefore, it is difficult to make the gas temperature constant especially over the surface of a large-area wafer and the reaction rate varies depending on the location on the wafer, so that a film having a uniform thickness is difficult to produce.

Then, a method of preliminary heating a reactant gas may be employed according to which the reactant gas is supplied into a chamber from piping provided outside a semiconductor manufacturing apparatus, and the gas is heated by a heater and then passed through a gas shower unit.

However, if the reactant gas is heated in advance before being passed through the gas shower unit, the reactant gas starts reacting before passing through the through holes of the gas shower unit. A resultant problem is clogging of the through holes of the gas shower unit or wastefully generated reaction products in the pre-heating portion. Another problem is that reaction products peel off to generate particles attaching onto the wafer surface as foreign matters or contaminants.

In order to solve above problems, a heater may be provided in a gas shower unit. If the gas shower unit having a heater therein is produced by providing a heater coil or wire between ceramics compact pieces and hot-press sintering them, the thickness of a base material of the gas shower unit is 10 mm or more because the heater coil embedded within the base material has an outer diameter of approximately 3 to 6 mm. As a result, through holes are likely to clog. Further, since the through holes should be formed not to touch the heater coil, there is a limitation on locations where the through holes are to be made. In this case, in many regions, the interval between through holes is 3 to 6 mm or more. In addition, if the gas shower unit has a greater thickness due to an embedded coil, the through holes are accordingly longer and thus likely to clog as described above.

A further method employed for ensuring uniform heating on a wafer where reaction occurs is that a gas shower unit is warmed by heat radiated from a wafer holder which has a heater therein and is located under a wafer, and after the gas shower unit is warmed to a predetermined temperature, gas is supplied therefrom.

In film deposition, a film is stacked not only on a wafer as a product but also on the gas shower unit, wafer holder and chamber. When the stacked film increases in thickness, thermal stress causes peeling of the film, which generates particles attached onto the product wafer, and accordingly defect occurs. Therefore, the surfaces of components within the chamber should be cleaned frequently. The optimum temperature for film deposition and that for cleaning are different. In general, such a gas as ClF3, NF3 or the like is used for cleaning. Since this type of gas would have too great etching power if used at the film deposition temperature, temperature in cleaning should be made lower than the film deposition temperature so as not to excessively damage the surfaces of the gas shower unit, wafer holder and chamber. Then, the temperature should be changed in the course from film deposition (high temperature), cleaning flow temperature), then to film deposition (high temperature) and so on. The gas shower unit having no heater therein is heated only by heat radiated from the heater located below and accordingly takes a considerable time to reach a predetermined temperature. In this case, the incorporated cleaning process constitutes a main factor in decrease of throughput in wafer processing.

SUMMARY OF THE INVENTION

One object of the present invention is to provide a gas shower unit for a semiconductor manufacturing apparatus and to provide a semiconductor manufacturing apparatus including therein the gas shower unit, to enable reaction to occur uniformly within a chamber of the semiconductor manufacturing apparatus such as CVD apparatus, plasma CVD apparatus, etching apparatus and the like while overcoming the problems above.

Another object of the invention is to provide a gas shower unit for a semiconductor manufacturing apparatus and to provide a semiconductor manufacturing apparatus including therein the gas shower unit, in which clogging of through holes hardly occurs in the gas shower unit of a thin type and in which a cleaning step can readily be done even when unnecessary films which could cause clogging or produce particles are deposited on the surfaces of components within a chamber of the semiconductor manufacturing apparatus, thus increasing throughput in wafer processing.

A gas shower unit for a semiconductor manufacturing apparatus according to the present invention has a base material of 5 mm or less in thickness, and includes a sintered ceramics base material having a plurality of through holes and an electrically conductive layer formed in the sintered ceramics base material.

A desirable gas shower unit for decreasing the frequency of cleaning steps has through holes which are not clogged for at least 24 hours. A gas shower unit can be employed which includes a base material of 5 mm or less in thickness with through holes each of a normal diameter (at least 0.01 mm) in order to prevent the through holes from being clogged for at least 24 hours. Accordingly, if the gas shower unit according to the present invention is employed, through holes hardly clog in the thin gas shower unit, and preliminary heating, which could cause clogging of the through holes, is unnecessary. Further, the heater can be included as the conductive layer in the gas shower unit so as to smoothly increase temperature, from a lower one at which cleaning is done for removing a deposited film attached to chamber components that generates particles, to a higher one at which a film is deposited on a wafer, and accordingly throughput in wafer processing can be enhanced. A desirable time period required to increase and decrease temperature is one hour or less in total. Including of the heater can reduce the time for increasing the temperature, and forming of a gas shower unit into a thin shape can reduce the time for decreasing the temperature.

Preferably, in consideration of uniform reaction, the gas shower unit according to the present invention includes an electrically conductive layer where a heater circuit pattern is formed. Accordingly, reactant gas is preliminarily heated when it passes through holes of the gas shower unit so that reaction uniformly occurs in a chamber for a semiconductor manufacturing apparatus. Occurrence of through hole clogging as well as generation of particles can thus be avoided.

Preferably, the electrically conductive layer of the gas shower unit according to the present invention includes an electrically conductive layer in which an electrode for generating plasma is formed. In this way, any space between a plasma upper electrode and the gas shower unit can be eliminated to obtain uniform plasma so that reaction can be made uniform within a chamber for a semiconductor manufacturing apparatus. It is thus possible to prevent clogging of through holes as well as generation of particles due to unnecessary films which might be formed in such a space as above.

Preferably, the sintered ceramics base material of the gas shower unit according to the present invention has at least 0.1 through holes per square centimeter each having a diameter of 0.01 mm or more. More preferably, the sintered ceramics base material has at least 0.5 through holes per square centimeter each having a diameter of 0.01 mm or more. The dimension and density of the above numerical values of through holes enables reactant gas to be supplied uniformly onto a semiconductor wafer within a chamber of a semiconductor manufacturing apparatus. Accordingly, temperature distribution over the semiconductor wafer can be made more uniform.

Ceramics used for the base material constituting the gas shower unit according to the present invention preferably includes any one of aluminum nitride, aluminum oxide, silicon nitride and aluminum oxynitride. The aluminum nitride is most preferred because of its heat conductivity and corrosion resistance. Such a ceramics material provides the base material of the gas shower unit with heat resistance as well as corrosion resistance against corrosive gas containing halogen, for example, used as a reactant gas.

Preferably, in the gas shower unit according to the present invention, the sintered ceramics base material includes a first sintered ceramics piece and a second sintered ceramics piece and the electrically conductive layer is preferably formed on a surface of the first sintered ceramics piece. The gas shower unit of the present invention preferably includes a joint layer interposed between the surface of the first sintered ceramics piece having the electrically conductive layer formed thereon and the second sintered ceramics piece, for coupling the first and second sintered ceramics pieces.

The gas shower unit of the present invention may be structured by forming a conductive layer on one surface or both surfaces of a sintered ceramics base material and forming a protective layer to cover a surface of the conductive layer. In one specific embodiment, a gas shower unit including a heater circuit therein may have a structure in which only one sintered ceramics piece is used as the sintered ceramics base material, a conductive layer is formed as a heater circuit pattern on one surface of the sintered ceramics piece, and a surface of the conductive layer is covered with a protective layer having a high corrosion resistance, preferably a protective layer formed of nonoxide ceramics in order to protect the conductive layer from corrosive gas such as halogen and the like. Alternatively, a gas shower unit including therein a heater circuit and a plasma upper electrode may have a structure in which only one sintered ceramics piece is used as the sintered ceramics base material, a conductive layer is formed as a heater circuit pattern on one surface of the sintered ceramics piece, a conductive layer is formed as a plasma upper electrode on the other surface of the sintered ceramics piece, and the surfaces of the conductive layers formed respectively on both surfaces of the sintered ceramics piece are covered with a protective layer having a high corrosion resistance, preferably a protective layer formed of nonoxide ceramics in order to protect the conductive layers from corrosive gas such as halogen and the like. In each of the gas shower units above, joining of sintered ceramics pieces is unnecessary and accordingly, factors causing defects such as joint gap can be reduced and yield can be increased. Further, since the gas shower unit is constituted using one sintered piece which reduces manufacturing cost.

The joint layer or protective layer preferably includes glass. If the gas shower unit is used at a high temperature with a high voltage applied thereto, the joint layer or protective layer more preferably includes nonoxide ceramics in terms of heat resistance, corrosion resistance and voltage resistance. In this case, the nonoxide ceramics preferably includes at least 50% by mass of any of aluminum nitride and silicon nitride.

If any of aluminum nitride, aluminum oxide, silicon nitride and aluminum oxynitride is used as ceramics constituting the base material, the joint layer above is preferably a glass layer having a coefficient of thermal expansion of at least $3.0 \times 10^{-6}/°C$. and at most $8.0 \times 10^{-6}/°C$. Use of such a glass layer as the joint layer enables the thermal expansion coefficient of the joint layer to be almost equal to that of the sintered ceramics piece. Consequently, thermal stress generated in joining, or heating and cooling of the gas shower unit can be decreased.

As the protective layer above, a glass having corrosion resistance as high as possible is preferably used. In consideration of reduction of thermal stress, the protective layer is preferably a glass layer having a thermal expansion coefficient of at least $3.0 \times 10^{-6}/°C$. and at most $8.0 \times 10^{-6}/°C$. The target time for heating the gas shower unit from room temperature to 600° C. is 30 minutes or less. If the thermal expansion coefficient falls in the range above, this target can be achieved.

If aluminum nitride is used as ceramics constituting the base material, in consideration of wetting and bonding properties, the joint layer including glass preferably includes oxide containing ytterbium (Yb), neodymium (Nd) and calcium (Ca) or includes a compound which generates oxide containing ytterbium (Yb), neodymium (Nd) and calcium (Ca) by being heated. If ceramics constituting the base material is silicon nitride, in consideration of wetting and bonding properties, the joint layer including glass preferably includes oxide containing yttrium (Y) and aluminum (Al) or includes a compound which generates oxide containing yttrium (Y) and aluminum (Al) by being heated.

If nonoxide ceramics is used as a material for the joint layer or protective layer, in consideration of thermal stress, nonoxide ceramics having a thermal expansion coefficient of at least $3.0 \times 10^{-6}/°C$. and at most $6.0 \times 10^{-6}/°C$. is preferably used.

Preferably, the conductive layer in the gas shower unit according to the present invention includes at least one of tungsten, molybdenum, silver, palladium, platinum, nickel and chromium.

Preferably, the conductive layer in the gas shower unit according to the present invention is formed along a plane within the sintered ceramics base material. Further, the gas shower unit preferably includes an external connection terminal which is formed along the same plane as that in the sintered ceramics base material to connect to the conductive layer and exposed from the sintered ceramics base material. It is accordingly possible to expose to reactant gas only the region of the sintered ceramics base material including the conductive layer therein and to locate the external connection terminal outside a chamber of a semiconductor manufacturing apparatus. Since the conductive layer included in the sintered ceramics base material and the external connection terminal coupled to the conductive layer are formed along the same plane, uniform heating of the gas shower unit as well as shortening of time period required for heating and cooling are possible. In other words, heating and cooling rates can be enhanced.

Preferably, the gas shower unit according to the invention further includes a temperature detection unit included in the sintered ceramics base material. Temperature distribution in the gas shower unit can thus be measured to control heating temperature of the gas shower unit.

A semiconductor manufacturing apparatus according to the present invention includes therein the semiconductor manufacturing apparatus gas shower unit structured in the above-described manner.

The semiconductor manufacturing apparatus according to the present invention is one selected from the group consisting of etching apparatus, CVD apparatus and plasma CVD apparatus.

According to the present invention, it is possible to provide, as a gas shower unit used for a semiconductor manufacturing apparatus such as CVD apparatus, plasma CVD apparatus, high temperature etching apparatus and the like where heating should be done more uniformly because of increased outer diameter of a semiconductor wafer to be processed, a structure having a heater function or a structure having both of the heater and plasma electrode functions. Use of a gas shower unit having such a structure enables reactant gas to be heated uniformly, and accordingly enables film deposition or etching to be done uniformly on a semiconductor wafer surface. In addition, there is generated no unnecessary film on the surface of the base material of the gas shower unit, and thus it is possible to prevent the concentration and flow rate of gas within a chamber from changing with time due to dogging of through holes. Further, it is possible to prevent particles from being generated resulting from peeling of a film attached to the surface of the base material of the gas shower unit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
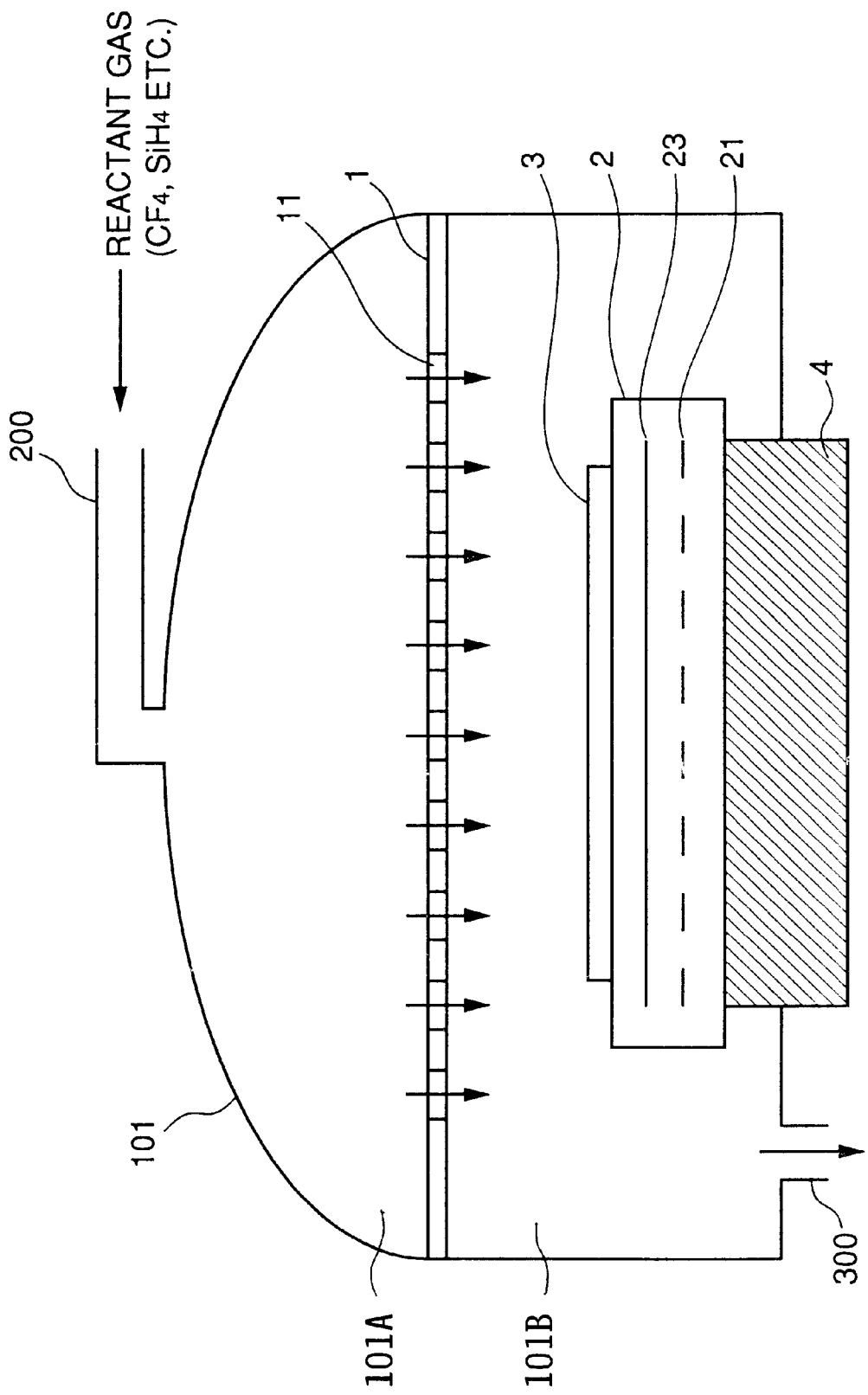
FIG. 1 illustrates one embodiment of a semiconductor manufacturing apparatus to which a gas shower unit according to the present invention is applicable.
Figure 2:
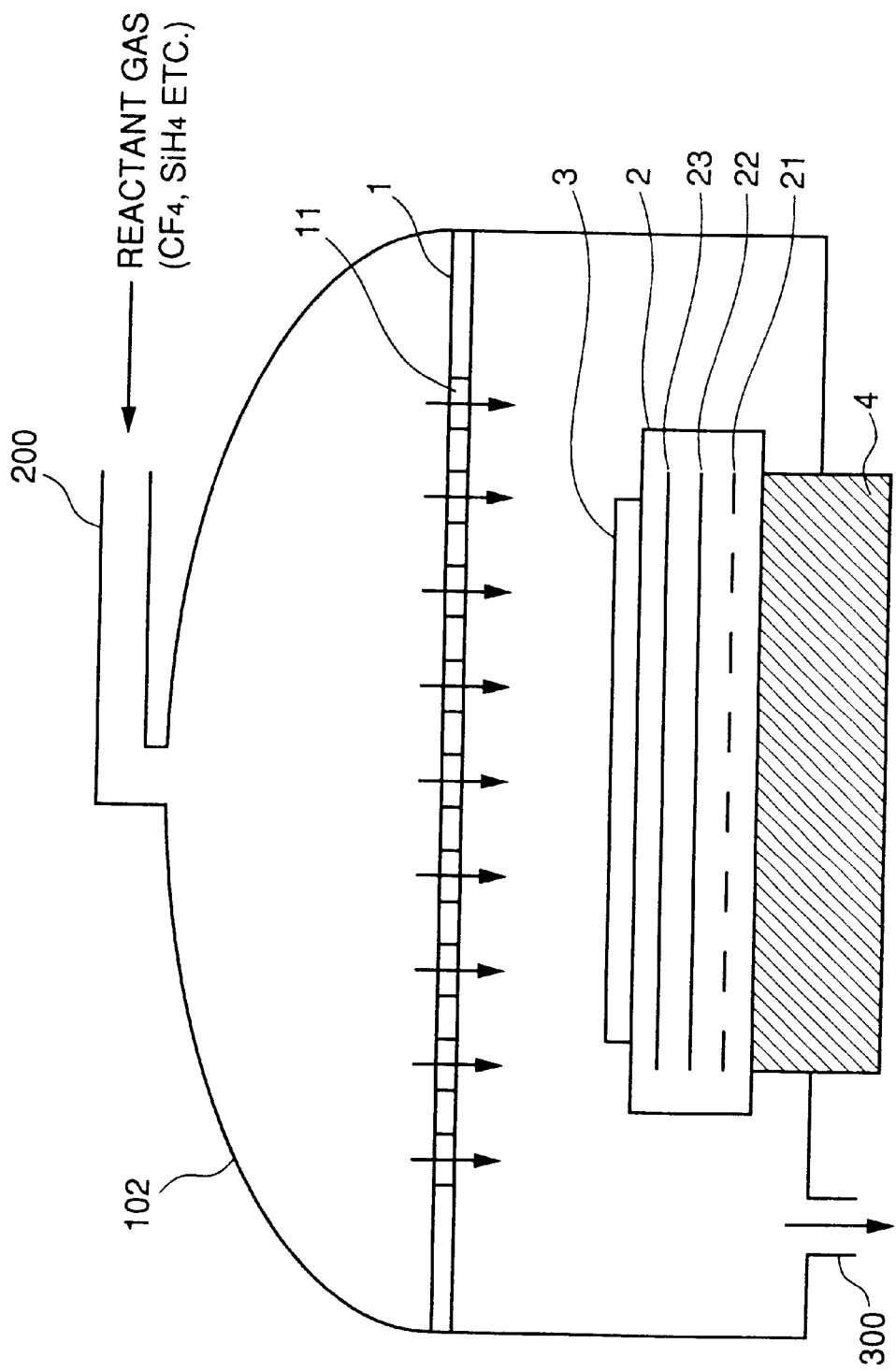
FIG. 2 illustrates another embodiment of the semiconductor manufacturing apparatus to which a gas shower unit according to the present invention is applicable.

FIGS. 1 and 2 respectively show embodiments of a semiconductor manufacturing apparatus to which a gas shower unit of the present invention is applied.

As shown in FIG. 1, a semiconductor wafer 3 to be processed by means of film deposition or etching is placed in a chamber 101 of a CVD apparatus or an etching apparatus. Semiconductor wafer 3 is fixed onto a wafer holder 2. Wafer holder 2 is attached to a supporter 4. Wafer holder 2 includes an electrostatic chuck electrode 23 for securing semiconductor wafer 3 by an electrostatic force, and a heater circuit 21 for heating semiconductor wafer 3. A gas shower unit 1 is placed above semiconductor wafer 3. Gas shower unit 1 comprises a gas shower plate that has a plurality of through holes 11 to pass reactant gas therethrough and includes therein a heater circuit pattern for heating the reactant gas. The heater circuit pattern is included in gas shower unit 1 in the form of an electrically conductive layer. Reactant gas for film deposition or etching gas is introduced from a gas inlet 200 into a gas introduction chamber 101A of chamber 101. The introduced gas passes through a plurality of through holes 11 into a processing chamber 101B of chamber 101 to be supplied onto the surface of semiconductor wafer 3. A predetermined film deposition or etching is done on the surface of semiconductor wafer 3. A gas discharge outlet 300 is provided for discharging gas from the inside of processing chamber 101B.

As shown in FIG. 2, in a chamber 102 used for a plasma CVD apparatus or a plasma etching apparatus, a semiconductor wafer 3 to be processed by means of film deposition or etching is placed. Semiconductor wafer 3 is fixed onto a wafer holder 2. Wafer holder 2 is attached onto a supporter 4. Wafer holder 2 includes a heater circuit 21 for heating semiconductor wafer 3, a plasma lower electrode 22 for generating plasma in chamber 102, and an electrostatic chuck electrode 23 for generating an electrostatic force to secure semiconductor wafer 3. A gas shower unit 1 is placed above semiconductor wafer 3. Gas shower unit 1 has a plurality of through holes 11 for passing reactant gas therethrough, and includes therein a plasma upper electrode opposite plasma lower electrode 22 and a heater circuit pattern for heating the reactant gas. The heater circuit pattern and the plasma upper electrode are included in the form of conductive layer in gas shower unit 1. Gas for film deposition or etching gas is introduced from a gas inlet 200 into chamber 102, passing through holes 11 of gas shower unit 1 to be supplied onto the surface of semiconductor wafer 3. Plasma discharge occurs between the plasma upper electrode included in gas shower unit 1 and plasma lower electrode 22 included in wafer holder 2. By the gas plasma thus generated, a predetermined film deposition or etching is performed on the surface of semiconductor wafer 3. A gas discharge outlet 300 is provided for discharging gas from the inside of chamber 102.

Figure 3:
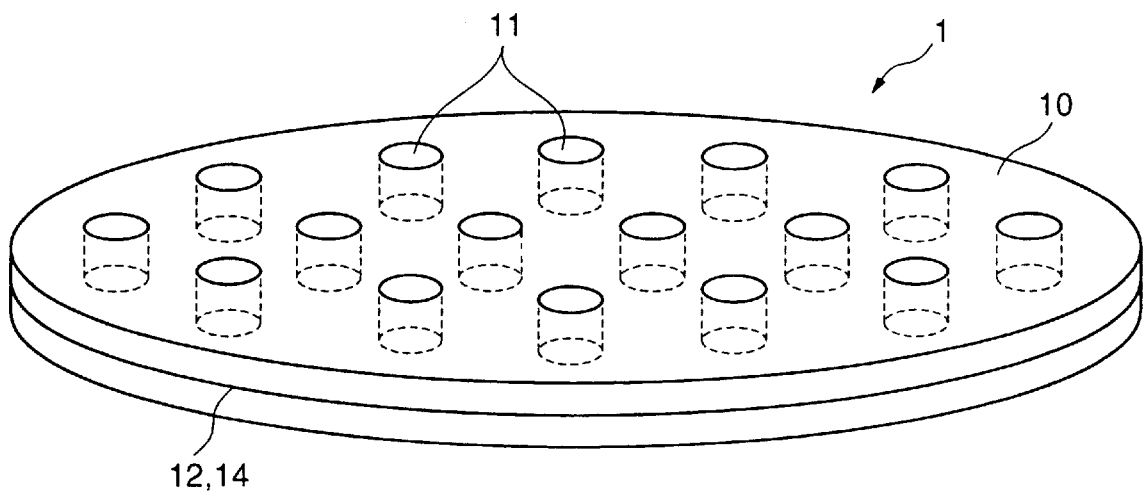
FIG. 3 is a perspective view illustrating one embodiment of a gas shower unit according to the present invention.

FIG. 3 is a perspective view illustrating one embodiment of the gas shower unit according to the present invention. As shown in FIG. 3, in gas shower unit 1, a base material 10 of sintered ceramics (hereinafter referred to as sintered ceramics base material 10) includes therein an electrically conductive layer where a heater circuit pattern 12 or a plasma upper electrode 14 is formed.

FIGS. 4 to 6, 9 and 10 respectively show cross sectional structures as respective embodiments of the gas shower unit according to the present invention.

Figure 4:
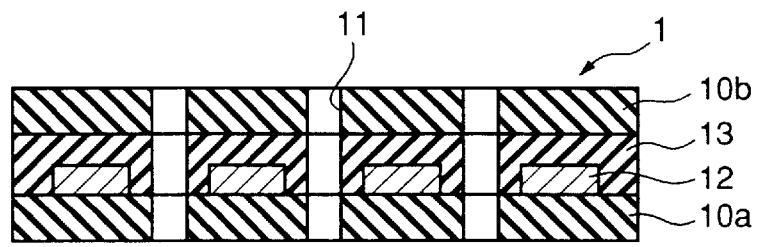
FIG. 4 shows a cross section of a gas shower unit including a heater function therein as one embodiment of the gas shower unit according to the present invention.

Referring to FIG. 4, gas shower unit 1 has a structure in which two sintered ceramics base materials 10a and 10b are joined. On one surface of sintered ceramics base material 10a, heater circuit pattern 12 is formed. Between the one surface of sintered ceramics base material 10a where the heater circuit pattern 12 is formed and a surface of sintered ceramics base material 10b, a glass layer or nonoxide ceramics layer 13 is provided to join sintered ceramics base materials 10a and 10b. A plurality of through holes 11 are formed to pass through sintered ceramics base material 10a, glass layer or nonoxide ceramics layer 13, and sintered ceramics base material 10b. Heater circuit pattern 12 is formed to avoid through holes 11.

Figure 5:
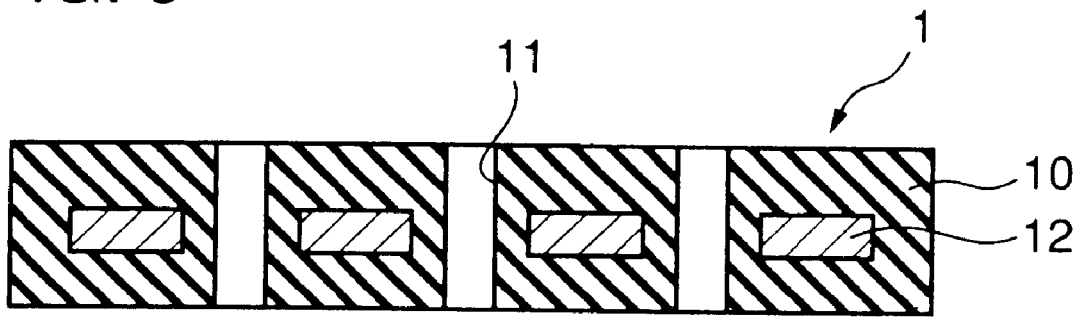
FIG. 5 shows a cross sectional structure of a gas shower unit including a heater function therein as another embodiment of the gas shower unit according to the invention.

Referring to FIG. 5, conductive paste may be applied between two ceramics compact pieces to sinter them, thereby producing heater circuit pattern 12 as a conductive layer within the resultant integrated sintered ceramics base material 10. In this case, gas shower unit 1 includes no glass layer or nonoxide ceramics layer as a joint layer.

Figure 6:
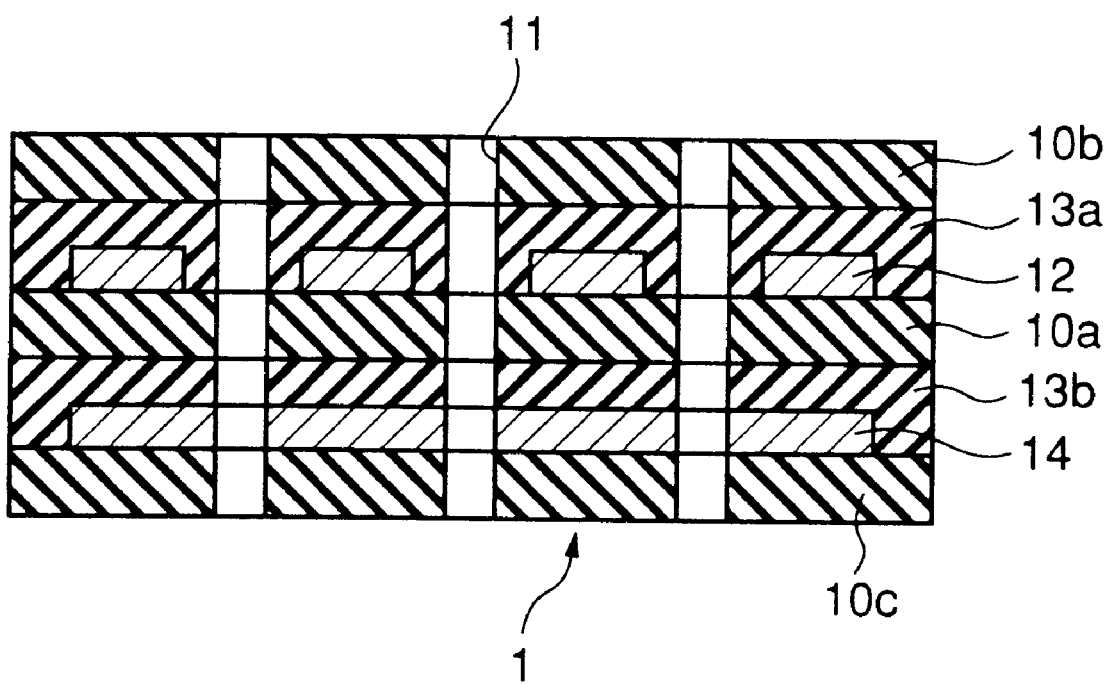
FIG. 6 shows a cross section of a gas shower unit having both of heater and plasma electrode functions as a further embodiment of the gas shower unit according to the invention.

Referring to FIG. 6, gas shower unit 1 includes therein heater circuit pattern 12 and plasma upper electrode 14 in the form of conductive layer. On one surface of sintered ceramics piece 10a, heater circuit pattern 12 is formed as a conductive layer. Sintered ceramics pieces 10a and 10b are joined by providing a glass layer or nonoxide ceramics layer 13a between the one surface of sintered ceramics piece 10a where heater circuit pattern 12 is formed and sintered ceramics piece 10b. Further, on one surface of a sintered ceramics piece 10c, plasma upper electrode 14 is formed as a conductive layer. Between the one surface of sintered ceramics piece 10c where plasma upper electrode 14 is formed and the other surface of sintered ceramics piece 10a, a glass layer or nonoxide ceramics layer 13b is formed so as to join sintered ceramics pieces 10a and 10c. In this way, gas shower unit 1 having the heater function and the plasma electrode is structured.

It is noted that gas shower unit 1 may include only one conductive layer serving both functions of a heater circuit pattern and a plasma upper electrode. Alternatively, the gas shower unit may be structured to include therein the plasma upper electrode only.

Figure 7:
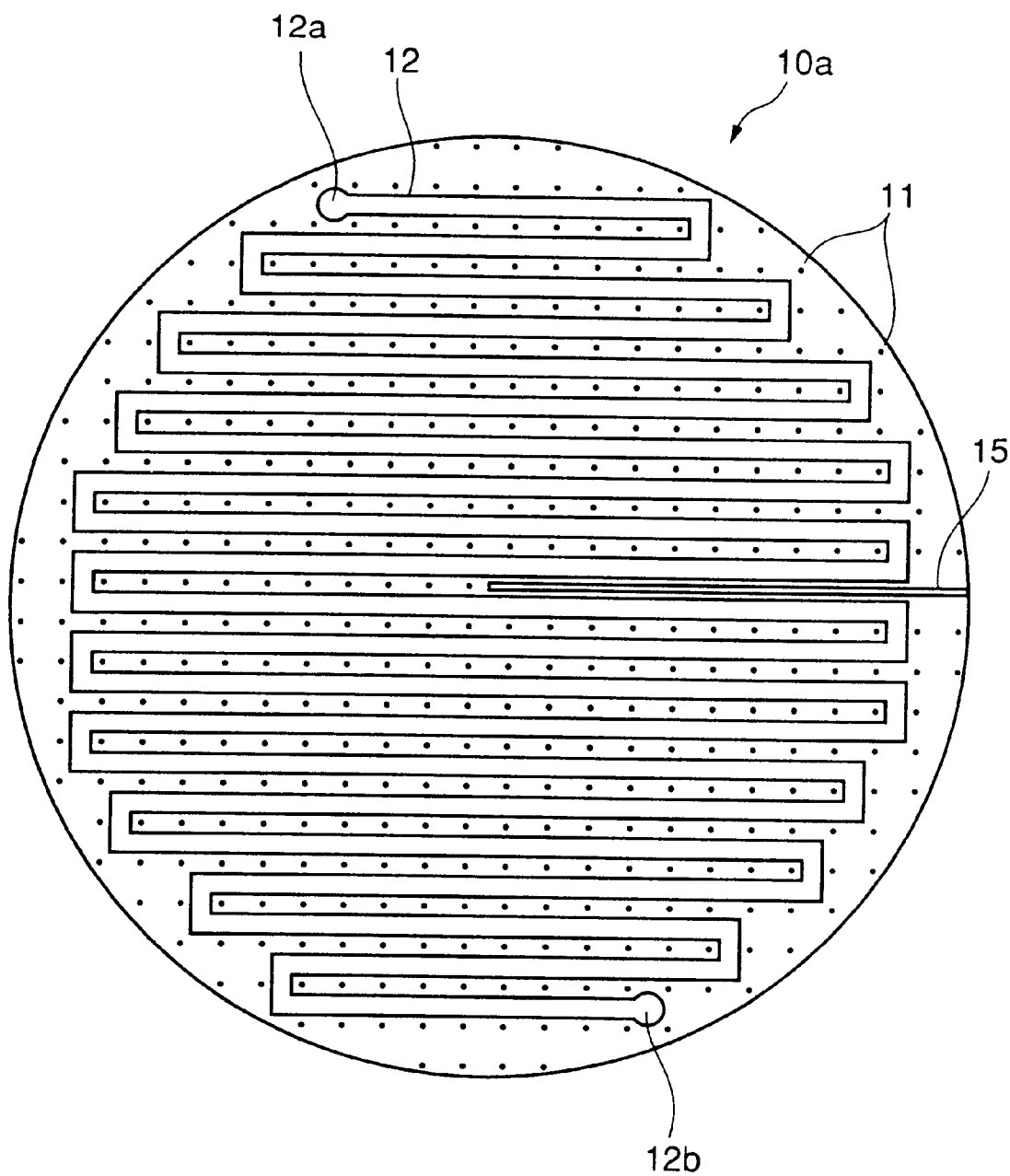
FIG. 7 is a plan view of the gas shower unit according to the invention showing, as one embodiment of a base material of the gas shower unit, one surface where a heater circuit pattern is formed.

FIG. 7 is a plan view showing one surface of sintered ceramics base material 10a where the heater circuit pattern is formed. As shown in FIG. 7, a plurality of fine through holes 11 are formed in one surface of sintered ceramics base material 10a. Heater circuit pattern 12 is formed in a zigzag following a certain pattern, avoiding contact with the locations of through holes 11. Circular connection terminals 12a and 12b are formed on both ends of heater circuit pattern 12 for connection to the outside. In addition, on the one surface of sintered ceramics base material 10a, a groove 15 is formed for insertion of a temperature sensor as a temperature detecting unit.

Figure 8:
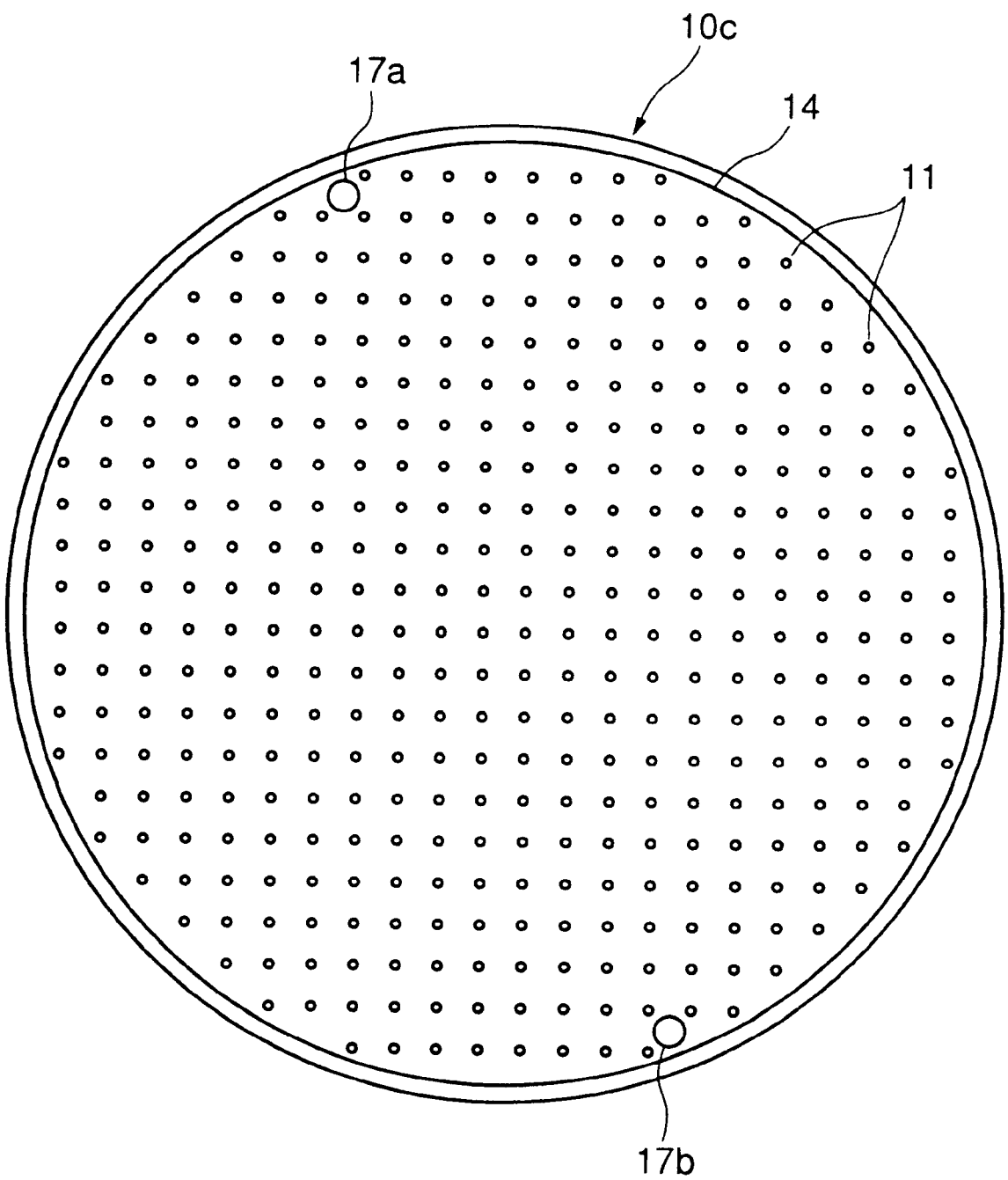
FIG. 8 is a plan view of the gas shower unit according to the invention showing, as one embodiment of a base material of the gas shower unit, one surface where a plasma upper electrode is formed.

FIG. 8 is a plan view showing one surface of a sintered ceramics base material where the plasma upper electrode is formed. As shown in FIG. 8, a plurality of fine through holes 11 are formed in the one surface of sintered ceramics base material 10c such that the locations of through holes 11 match respective through holes of sintered ceramics base material 10a shown in FIG. 7. Two through holes 17a and 17b are formed to match, in location, connection terminals 12a and 12b respectively of the heater circuit pattern shown in FIG. 7. Plasma upper electrode 14 is formed on the one surface of sintered ceramics base material 10c to cover almost entire surface without blocking up openings of through holes 11.

Figure 9:
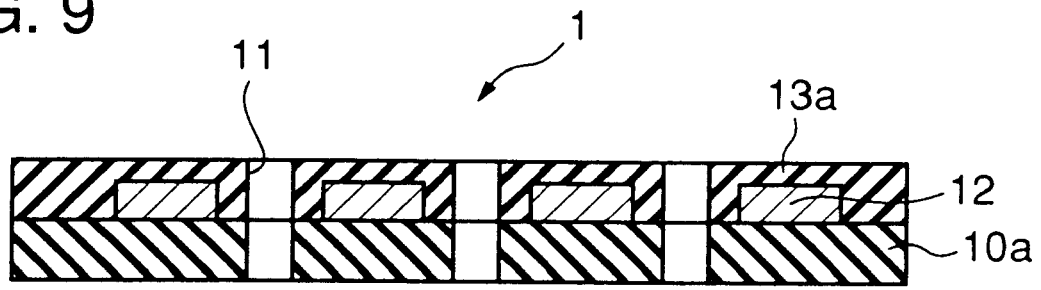
FIG. 9 shows a cross section of a gas shower unit having a heater function therein as a further embodiment of the gas shower unit according to the invention.

Referring to FIG. 9, heater circuit pattern 12 is formed as a conductive layer on one surface of sintered ceramics piece 10a. Nonoxide ceramics layer 13a is used to cover the one surface of sintered ceramics piece 10a where heater circuit pattern 12 is formed in order to form a protective layer for protecting the heater circuit pattern from corrosive gas such as halogen and the like. In this way, one sintered ceramics piece 10a may be used to construct gas shower unit 1 including therein heater circuit pattern 12 in the form of a conductive layer.

Figure 10:
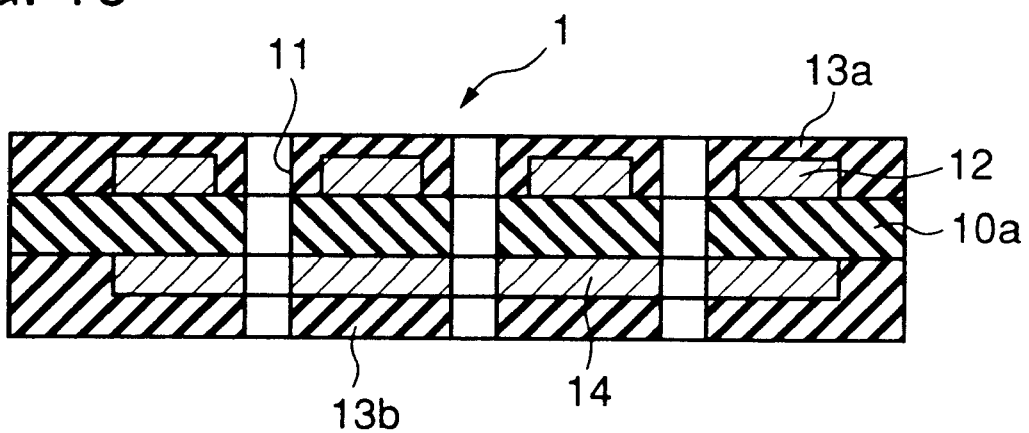
FIG. 10 shows a cross section of a gas shower unit having both of heater and plasma electrode functions as a further embodiment of the gas shower unit according to the invention.

Alternatively, referring to FIG. 10, heater circuit pattern 12 and plasma upper electrode –may be formed in the form of conductive layers respectively on one surface and the other surface of sintered ceramics piece 10a. In this case, nonoxide ceramics layers 13a and 13b covering the conductive layers respectively are used to form protective layers for protecting heater circuit pattern 12 and plasma upper electrode 14 as the conductive layers from corrosive gas such as halogen and the like. In this way, one sintered ceramics piece 10a may be used to construct gas shower unit 1 including therein heater circuit pattern 12 and plasma upper electrode 14 in the form of conductive layers.

Figure 11:
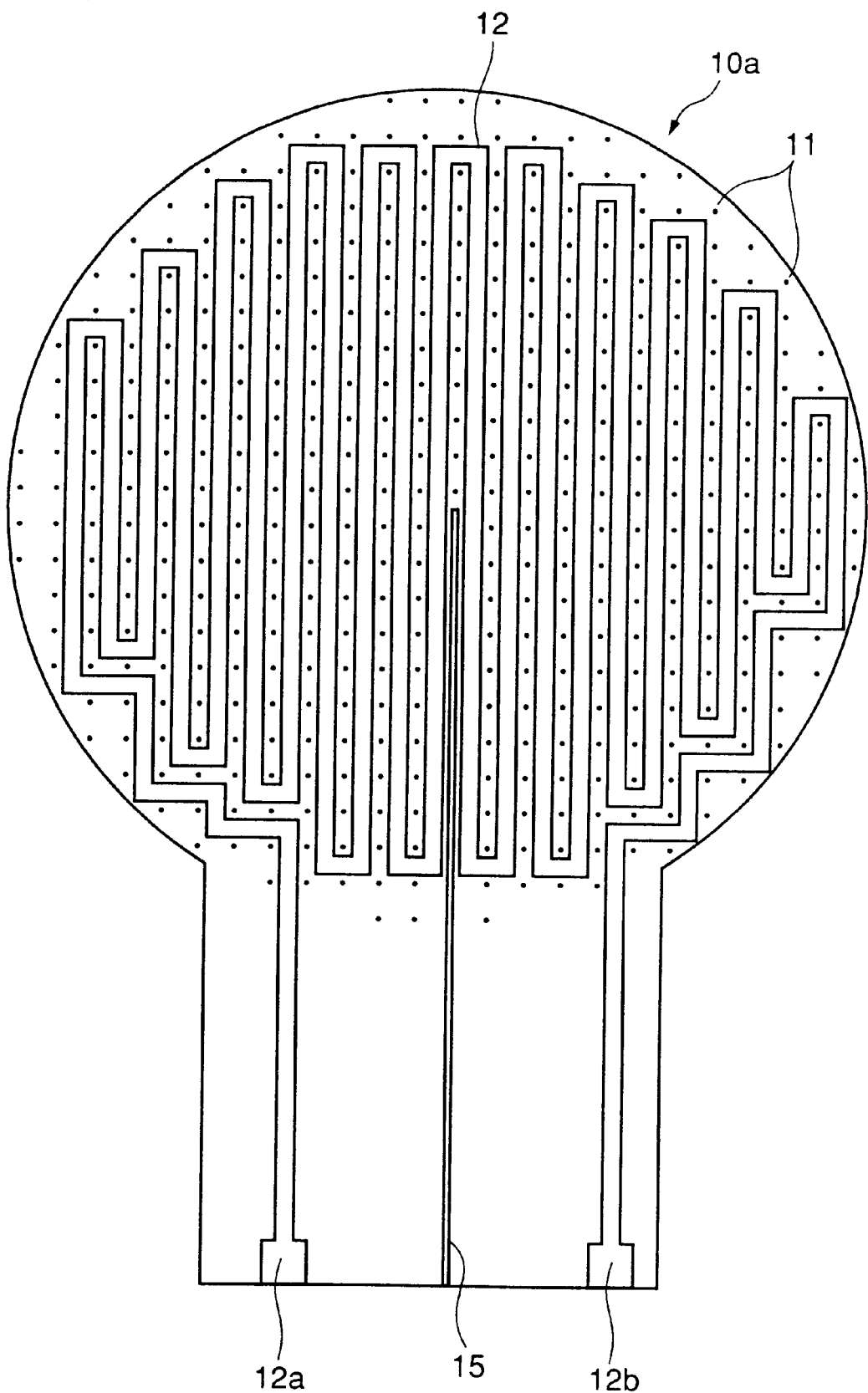
FIG. 11 is a plan view of the gas shower unit according to the invention showing, as another embodiment of a base material of the gas shower unit, one surface where a heater circuit pattern is formed.

FIG. 11 is a plan view showing, as another embodiment, one surface of sintered ceramics base material 10a where a heater circuit pattern is formed. As shown in FIG. 11, connection terminals 12a and 12b are formed along the same plane on the one surface of sintered ceramics base material 10a to be connected to heater circuit pattern 12. Connection terminals 12a and 12b extend to a side surface for connection to lines outside the chamber of the semiconductor manufacturing apparatus. A groove 15 also extends to the side surface of sintered ceramics base material 10a for inserting a temperature sensor therein from the outside of the chamber of the semiconductor manufacturing apparatus. Based on temperature measured by the temperature sensor, the temperature of the gas shower unit can be controlled by using a temperature adjustment module provided outside the semiconductor manufacturing apparatus.

Figure 12:
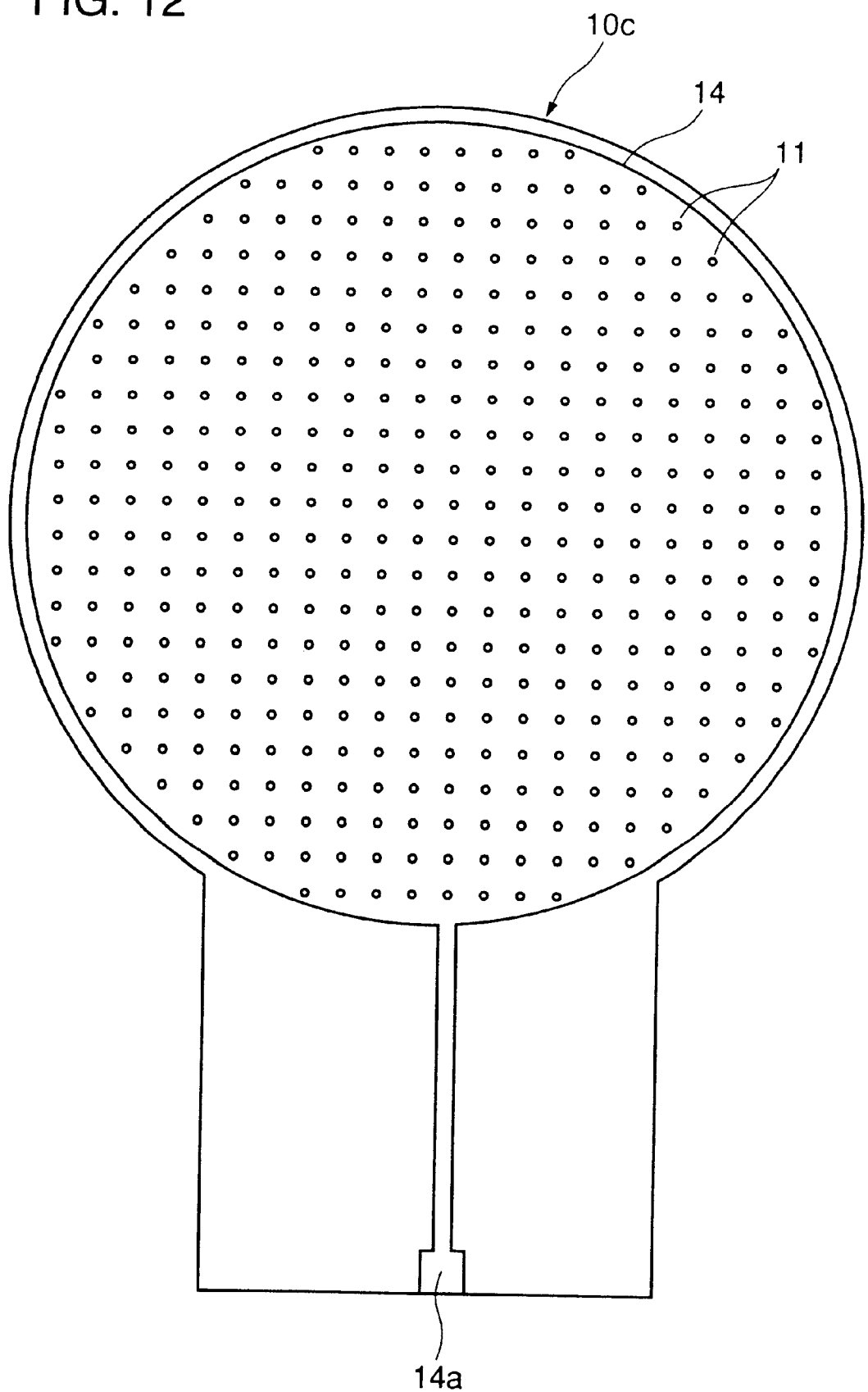
FIG. 12 is a plan view of the gas shower unit according to the invention showing, as a further embodiment of a base material of the gas shower unit, one surface where a plasma upper electrode is formed.

FIG. 12 is a plan view showing, as another embodiment, one surface of sintered ceramics base material 10c where a plasma upper electrode is formed. As shown in FIG. 12, a connection terminal 14a is formed along the same plane on the one surface of sintered ceramics base material 10c to be connected to plasma upper electrode 14. Connection terminal 14a extends to a side surface of sintered ceramics base material 10c for connection to lines outside the chamber of the semiconductor manufacturing apparatus.

A sintered ceramics piece constituting a base material of the gas shower unit of the present invention can be manufactured by means of a conventional method. Specifically, a sintering agent is added to ceramics powder as required, a binder is further added if necessary, and then a compact piece of that powder mixture is sintered. Since ceramics has heat resistance as well as corrosion resistance against corrosive gas including halogen and the like, aluminum nitride, aluminum oxide, silicon nitride and aluminum oxynitride are preferred. Among them, aluminum nitride is most preferred because of its heat conductivity and corrosion resistance.

As a method of compacting ceramics powder, any of well-known sheet forming methods such as doctor blade process, extrusion, press and the like is used. The compact piece is dried and then undergoes punching or cutting into a shape which allows the degree of shrinkage after sintering. Through holes may be made at this stage, or by machining after sintered pieces are joined.

Binder is removed from the compact piece and thereafter the compact piece is sintered, preferably at a normal pressure. However, there is no particular limitation on this pressure. The surface of the sintered piece may be polished or the sintered piece may be cut if necessary. However, if the dimension and warp of the sintered piece fall in a predetermined range, the sintered piece may directly be used as the base material of the gas shower unit.

In order to form a conductive layer on the surface of the sintered ceramics piece, paste containing conductive material, for example, refractory metal such as tungsten, molybdenum and the like or mixture thereof, or metal or alloy such as silver, silver-palladium, nickel-chromium and the like is applied by printing on the surface of the sintered piece and then baked. Between the sintered ceramics piece having the conductive layer formed thereon and another sintered ceramics piece, a joint element such as glass, nonoxide ceramics or the like is applied. The ceramics pieces overlaid on each other are accordingly joined. In this way, the gas shower unit can be manufactured having the sintered ceramics base material within which the conductive layer is included.

The manufacturing method discussed above employs so-called post metalizing method according to which a conductive layer is formed by applying paste containing conductive material onto a sintered ceramics piece and then baking it. Alternatively, the co-fire method may be employed for providing within a sintered ceramics base material a conductive layer corresponding to a heater circuit pattern or plasma upper electrode. According to the co-fire method, paste containing refractory metal such as tungsten, molybdenum and the like or mixture thereof is applied by printing onto a surface of a ceramics compact piece, another ceramics compact piece is overlaid thereon to bind them through thermal compression, the compact pieces are deprived of binder, and then sintering of the compact ceramics pieces and baking of the conductive paste are simultaneously performed.

In order to provide within a sintered ceramics base material a conductive layer serving both of heater and plasma upper electrode functions, two conductive layers may be formed respectively as a heater circuit pattern and a plasma upper electrode to manufacture the gas shower unit as the one having two conductive layers therein. Alternatively, for the purpose of reducing the size, one conductive layer serving both of heater and plasma upper electrode functions may be formed.

In order to supply reactant gas uniformly onto the surface of a semiconductor wafer, preferably through holes each having a diameter of at least 0.01 mm are formed at a density of not lower than 0.1 holes/cm$^2$, preferably not lower than 0.5 holes/cm$^2$.

EXAMPLE 1

5% by mass of Yttria (Y$_2$O$_3$) as sintering agent and binder were added to aluminum nitride powder. They were dispersively mixed and the resultant mixture was compacted by doctor blade process such that it would have a thickness of 1.0 mm after sintered. The compact piece was dried and then underwent punching such that it would have an outer diameter of 350 mm after sintered. 500 through holes were punched out such that they would each have a diameter of 0.5 mm after sintered. The resultant compact piece was degreased in nitrogen gas flow at 800° C. and sintered at 1800° C. for 4 hours. The upper and lower surfaces of the resultant sintered piece were polished by using diamond abrasive. By this process, two base materials of sintered aluminum nitride were produced.

Tungsten powder and sintering agent were kneaded with ethyl cellulose binder and applied by printing onto one surface of one sintered aluminum nitride base material. The printed pattern was a linear one with a line width of 3.0 mm. The linear pattern was shaped in zigzag as shown in FIG. 7 to avoid the openings of through holes. The sintered aluminum nitride piece having such a pattern printed thereon was degreased in nitrogen gas at 800° C. and baked in nitrogen gas at 1700° C. to generate a conductive layer.

Glass powder was applied by printing onto one surface of another sintered aluminum nitride base material, and degreased at 500° C. The sintered aluminum nitride base materials were stacked such that the surfaces respectively having the printed glass powder and the conductive layer faced each other. The base materials were fixed by a jig made of molybdenum, and then joined in nitrogen gas at 650° C. with a weight placed thereon. In this way, the gas shower unit as shown in FIG. 4 was manufactured that is formed of a sintered aluminum nitride base material including a heater circuit pattern therein. The gas shower unit was 2.0 mm in thickness.

The gas shower unit thus obtained was incorporated into the CVD apparatus shown in FIG. 1. A silicon wafer 3 of 300 mm in diameter was mounted on wafer holder 2 and heated to 700° C. On the other hand, 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±0.4° C. Further, a process was conducted for 100 hours in which a titanium nitride (TiN) film was formed on the surface of silicon wafer 3 by using a predetermined reactant gas. In this period, no film was formed and no film adhered on the surface of gas shower unit 1 and in through holes 11. On the surface of silicon wafer 3, no particle of 0.05μm or more in size was generated. After the reaction, power supply to heater circuit pattern 12 of gas shower unit 1 was stopped, and the temperature of gas shower unit 1 fell from 600° C. to room temperature in 10 minutes. When voltage of 200 V was applied as power supply to heater circuit pattern 12, the temperature of gas shower unit 1 rose from room temperature to 600° C. in 6 minutes. The gas shower unit had no crack or the like found in temperature increase and decrease.

EXAMPLE 2

Two base materials of sintered aluminum nitride were produced by the same method as that in Example 1. A gas shower unit similar to that in Example 1 was manufactured except that the number of through holes was 100.

The obtained gas shower unit 1 was incorporated into the CVD apparatus as shown in FIG. 1. A silicon wafer 3 of 300 mm in diameter was mounted on wafer holder 2 and heated to 700° C. 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 in this state measured by a radiation thermometer was ±4.0° C. Further, a process was conducted for 100 hours in which a titanium nitride (TiN) film was formed on the surface of silicon wafer 3. In this period, no film was formed and no film adhered on the base material surface of gas shower unit 1 and in through holes 11. On the surface of silicon wafer 3, no particle of 0.05 μm or more in size was generated. After the reaction, power supply to heater circuit pattern 12 was stopped, and the temperature of gas shower unit 1 changed from 600° C. to room temperature in 10 minutes. When voltage of 200 V was applied as power supply to heater circuit pattern 12, the temperature of gas shower unit 1 changed from room temperature to 600° C. in 6 minutes.

EXAMPLE 3

Using the same manufacturing method as that in Example 1, three base materials of sintered aluminum nitride were produced each having thickness and diameter respectively of 1 mm and 350 mm and through holes of the same number.

Tungsten powder and sintering agent were kneaded with binder and applied by printing onto one surface of one of the base materials of sintered aluminum nitride. The printed pattern was linear one with line width of 0.5 mm and line interval of 0.5 mm. This linear pattern was shaped in zigzag avoiding contact with locations of the openings of through holes as shown in FIG. 7.

Tungsten powder and sintering agent kneaded with binder were also applied by printing onto one surface of another one base material of sintered aluminum nitride. The printed pattern was substantially circular one which did not to block the openings of through holes and accordingly a plasma upper electrode as shown in FIG. 8 was formed.

The printed patterns respectively on the surfaces of respective two base materials of sintered aluminum nitride were baked in a similar manner to that in Example 1 so as to form conductive layers which respectively form a heater circuit pattern and a plasma upper electrode on the base materials of sintered aluminum nitride.

The two base materials of sintered aluminum nitride and a remaining one base material of sintered aluminum nitride were joined in a similar manner to that in Example 1 by providing glass layer therebetween. In this way, gas shower unit 1 was manufactured as shown in FIG. 6 having therein heater circuit pattern 12 and plasma upper electrode 14. The obtained gas shower unit had a thickness of 3.0 mm.

Gas shower unit 1 thus manufactured was incorporated into a plasma CVD apparatus for forming silicon oxide film ($SiO_2$ film) as shown in FIG. 2. A silicon wafer 3 of 300 mm in diameter was mounted on wafer holder 2 and heated to 300° C. 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 in this state measured by a radiation thermometer was ±0.5° C. Further, a process was conducted for 50 hours in which 200 V was also applied to plasma upper electrode 14 of gas shower unit 1 to generate gas plasma within chamber 102 and then a silicon oxide film was formed on the surface of silicon wafer 3. In this period, clogging of through holes occurred which required cleaning. On the surface of silicon wafer 3, no particle of 0.05 μm or more in size was generated. After the reaction, power supply to heater circuit pattern 12 and plasma upper electrode 14 was stopped, and the temperature of gas shower unit 1 fell from 600° C. to room temperature in 13 minutes. When voltage of 200 V was applied as power supply to heater circuit pattern 12, the temperature of gas shower unit 1 rose from room temperature to 600° C. in 10 minutes.

EXAMPLE 4

3% by mass of Yttria ($Y_2O_3$) as sintering agent and 1% by mass of calcium oxide (CaO) as binder were added to aluminum nitride powder. They were dispersively mixed and the resultant powder mixture was compacted by doctor blade process such that it would have a thickness of 1.0 mm after sintered. The compact piece was dried and then underwent punching such that it would have an outer diameter of 350 mm after sintered. 500 through holes were punched out such that they would each have a diameter of 0.5 mm after sintered. Tungsten powder and sintering agent were kneaded with ethyl cellulose binder and applied by printing onto one surface of the compact piece. The printed pattern was a linear one with a line width of 2.0 mm. The linear pattern was shaped in zigzag as shown in FIG. 7 to avoid contact with locations of the openings of through holes. On the aluminum nitride compact piece having the printed pattern formed thereon, another aluminum nitride compact piece was overlaid to bind them through thermal compression. The two aluminum nitride compact pieces bound by thermal compression were degreased in nitrogen gas flow at 800° C and sintered at 1800° C. for 4 hours. Accordingly, the printed pattern and aluminum nitride were simultaneously sintered. In this way, gas shower unit 1 as shown in FIG. 5 was manufactured that was formed of base material of sintered aluminum nitride 10 integrated with heater circuit pattern 12 provided therein. The thickness of the gas shower unit thus produced was 2.0 mm.

The resultant gas shower unit 1 was incorporated into the CVD apparatus as shown in FIG. 1. A silicon wafer 3 of 300 mm in diameter was mounted on wafer holder 2 and heated to 700° C. On the other hand, 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±0.5° C.

Further, a process was conducted for 100 hours in which a titanium nitride (TiN) film was deposited on the surface of silicon wafer 3. In this period, no film was formed and no film adhered on the surface of the base material of gas shower unit 1 and in through holes. On the surface of silicon wafer 3, no particle of 0.05 μm or more in size was generated. After the reaction, power supply to heater circuit pattern 12 was stopped, and the temperature of gas shower unit 1 fell from 600° C. to room temperature in 10 minutes. When voltage of 200 V was applied as power supply to heater circuit pattern 12, the temperature of gas shower unit 1 rose from room temperature to 600° C. in 6 minutes.

EXAMPLE 5 TO 17

In Examples 5 to 17, through holes were formed by the same method as that in Example 1 and a polished sintered piece of aluminum nitride was produced.

Tungsten powder and sintering agent kneaded with ethyl cellulose-based binder were applied by printing onto one surface of one sintered piece of aluminum nitride. This was degreased in nitrogen gas at 900° C. and baked in nitrogen gas at 1700° C. so as to produce a heater circuit pattern as a conductive layer.

On one surface of another sintered piece of aluminum nitride, powder mixture of nonoxide ceramics and oxide ceramics or oxide ceramics powder kneaded with ethyl cellulose-based binder, having the composition of joint layer as shown in Table 2 below, was applied by printing. This was degreased in nitrogen gas at 900° C. The sintered pieces of aluminum nitride were stacked such that the surface having the heater circuit pattern formed thereon faced the surface having the joint layer. The sintered pieces were fixed by a jig made of carbon and load was applied thereto. In this state, the sintered pieces were joined by being heated in nitrogen gas at the joint temperature as shown in Table 2.

In this way, a gas shower unit was manufactured that is formed of the base material of sintered aluminum nitride including therein the heater circuit pattern as shown in FIG. 4. The gas shower unit thus produced had a thickness of 2.0 mm.

This gas shower unit 1 was incorporated into the CVD apparatus shown in FIG. 1. A silicon wafer 3 of 300 mm in diameter was mounted on wafer holder 2 and heated to 750° C. On the other hand, 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±0.5° C. Further, a process was conducted for 100 hours in which a titanium nitride (TiN) film was deposited on the surface of silicon wafer 3 by using a predetermined reactant gas. In this period, no film was formed and no film adhered on the surface of gas shower unit 1 and in through holes 11. On the surface of silicon wafer 3, no particle of 0.05 μm or more in size was generated. After the reaction, power supply to heater circuit pattern 12 of gas shower unit 1 was stopped, and the temperature of gas shower unit 1 fell from 600° C. to room temperature in 10 minutes. When voltage of 200 V was applied as power supply to heater circuit pattern 12, the temperature of gas shower unit 1 rose from room temperature to 600° C. in 6 minutes.

In Examples 1 to 4, no problem occurred when the gas shower units were continuously used for 1000 hours in a fluorine atmosphere at 700° C. When the gas shower unit were continuously used for 1000 hours at 750° C., there was found degradation in one heater out of ten heaters. When the gas shower units were continuously used for 1000 ours at 800° C., degradation was found in three out of ten heaters. The reason is considered to be lowered heater protection effect due to thermal deterioration of the glass layer.

In Examples 5 and 11, no problem arose when the gas shower units were successively used for 1000 hours in a fluorine atmosphere at 700° C. and for 1000 hours at 750° C. However, when the gas shower units were successively used for 1000 hours at 800° C., deterioration was found in one out of ten heaters.

In Examples 6 to 10 and 12 to 17, there was no problem when the gas shower units were successively used for 1000 hours at any of the temperatures 700° C., 750° C. and 800° C.

EXAMPLE 18

5% by mass of $Y_2O_3$ and 2% by mass of $Al_2O_3$ as sintering agent were added to silicon nitride powder, polyvinyl alcohol was added thereto as binder, and they were dispersively mixed by a ball mill using ethanol as solvent. The powder mixture was spray-dried and then press-formed to have a shape of 350 mm in diameter 1 mm in thickness after sintered. The resultant compact piece was degreased in nitrogen gas at 800° C., and sintered at 1550° C., for 4 hours. The top and bottom surfaces of the produced sintered piece of silicon nitride were polished by diamond abrasive.

A tungsten heater circuit pattern was formed on one sintered piece of silicon nitride by the same method as that in Example 1. On another sintered piece of silicon nitride, a layer of $SiO_2$-$Al_2O_3$-based oxide ceramics having a thermal expansion coefficient of $5.0 \times 10^{-6}/°C$. was formed. The two sintered pieces were stacked and joined by heating them in nitrogen gas at 1100° C.

Gas shower unit 1 accordingly manufactured was incorporated into the CVD apparatus shown in FIG. 1. A silicon wafer 3 of 300 mm in diameter was mounted on wafer holder 2 and heated to 750° C. On the other hand, 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±2.0° C. Further, a process was conducted for 100 hours in which a titanium nitride (TiN) film was deposited on the surface of silicon wafer 3 by using a predetermined reactant gas. In this period, no film was formed and no film adhered on the surface of gas shower unit 1 and in through holes 11. On the surface of silicon wafer 3, no particle of 0.05 μm or more in size was generated. After the reaction, power supply to heater circuit pattern 12 of gas shower unit 1 was stopped, and the temperature of gas shower unit 1 fell from 600° C. to room temperature in 20 minutes. When voltage of 200 V was applied as power supply to heater circuit pattern 12, the temperature of gas shower unit 1 rose from room temperature to 600° C. in 15 minutes.

EXAMPLE 19

2% by mass of MgO was added as sintering agent to aluminum oxynitride (AlON) powder, binder was added thereto, and they were dispersively mixed. The powder mixture was spray-dried and then press-formed to have a shape of 350 mm and 1 mm respectively in diameter and thickness after sintered. The resultant compact piece was degreased in nitrogen gas flow at 800° C. and thereafter sintered at 1770° C. for 4 hours. The top and bottom surfaces of the produced sintered piece of aluminum oxynitride were polished by diamond abrasive.

A tungsten heater circuit pattern was formed on one sintered piece of aluminum oxynitride by the same method as that in Example 1. On another sintered piece of aluminum oxynitride, a layer of $SiO_2$-$Al_2O_3$-based oxide ceramics having a thermal expansion coefficient of $5.0 \times 10^{-6}/°C$. was formed. The two sintered pieces were stacked and joined by heating them in nitrogen gas at 1100° C.

Gas shower unit 1 accordingly produced was incorporated into the CVD apparatus shown in FIG. 1. A silicon wafer 3 of 300 mm in diameter was mounted on wafer holder 2 and heated to 750° C. On the other hand, 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±3.0° C. Further, a process was performed for 100 hours in which a titanium nitride (TiN) film was deposited on the surface of silicon wafer 3 by using a predetermined reactant gas. In this period, no film was formed and no film adhered on the surface of gas shower unit 1 and in through holes 11. On the surface of silicon wafer 3, no particle of 0.05 μm or more in size was generated. After the reaction, power supply to heater circuit pattern 12 of gas shower unit 1 was stopped, and the temperature of gas shower unit 1 fell from 600° C. to room temperature in 20 minutes. When voltage of 200 V was applied as power supply to heater circuit pattern 12, the temperature of gas shower unit 1 rose from room temperature to 600° C. in 15 minutes.

EXAMPLE 20

One base material of sintered aluminum nitride was produced by the same method as that in Example 1. Through holes were formed in the base material of sintered aluminum nitride and a conductive layer of tungsten was formed in a similar manner to that in Example 1. Paste of aluminum nitride powder to which 3% by mass of Yb-Nd-Ca-O-based glass was added was printed on the surface of this conductive layer to cover it, and then baked at 1650° C.

Gas shower unit 1 accordingly manufactured was incorporated into the CVD apparatus shown in FIG. 1. A silicon wafer 3 of 300 mm in diameter was mounted on wafer holder 2 and heated to 700° C. On the other hand, 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±0.4° C. Further, a process was conducted for 150 hours in which a titanium nitride (TiN) film was deposited on the surface of silicon wafer 3 by using a predetermined reactant gas. In this period, no film was formed and no film adhered on the surface of gas shower unit 1 and in through holes 11. On the surface of silicon wafer 3, no particle of 0.05 μm or more in size was generated. After the reaction, power supply to heater circuit pattern 12 of gas shower unit 1 was stopped, and the temperature of gas shower unit 1 fell from 600° C. to room temperature in 7 minutes. When voltage of 200 V was applied as power supply to heater circuit pattern 12, the temperature of gas shower unit 1 rose from room temperature to 600° C. in 5 minutes.

EXAMPLE 21

Five base materials of sintered aluminum nitride were produced by the same method as that in Example 1. On one base material of sintered aluminum nitride, a tungsten conductive layer was formed by using the same method as that in Example 1. Glass layers were provided between five sintered pieces respectively to join the sintered pieces by the same method as that in Example 1. In this way, a gas shower unit similar to that of Example 1 was manufactured.

Gas shower unit 1 thus obtained was incorporated into the CVD apparatus shown in FIG. 1. A silicon wafer 3 of 300 mm in diameter was mounted on wafer holder 2 and heated to 700° C. On the other hand, 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±0.6° C. Further, a process was conducted for 30 hours in which a titanium nitride (TiN) film was deposited on the surface of silicon wafer 3 by using a predetermined reactant gas. In this period, clogging was found in through holes 11. Particles were generated on the surface of silicon wafer 3 and then cleaning became necessary. After this, power supply to heater circuit pattern 12 of gas shower unit 1 was stopped, and the temperature of gas shower unit 1 fell from 600° C. to room temperature in 17 minutes. When voltage of 200 V was applied as power supply to heater circuit pattern 12, the temperature of gas shower unit 1 rose from room temperature to 600° C. in 7 minutes.

EXAMPLE 22

Two base materials of sintered aluminum nitride were produced by the same method as that in Example 1. A gas shower unit similar to the one in Example 1 was manufactured except that the number of through holes was 30.

Gas shower unit 1 thus obtained was incorporated into the CVD apparatus shown in FIG. 1. A silicon wafer 3 of 300 mm in diameter was mounted on wafer holder 2 and heated to 700° C. On the other hand, 200 V was applied to heater circuit pattern 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±7.0° C. Further, a process was conducted for 100 hours in which a titanium nitride (TiN) film was deposited on the surface of silicon wafer 3. In this period, no clogging was observed in through holes 11.

After this, power supply to heater circuit pattern 12 was stopped, and the temperature of gas shower unit 1 fell from 600° C. to room temperature in 10 minutes. When voltage of 200 V was applied as power supply to heater circuit pattern 12, the temperature of gas shower unit 1 rose from room temperature to 600° C. in 6 minutes.

EXAMPLE 23

Two base materials of sintered aluminum nitride were produced by the same method as that in Example 1. A gas shower unit was manufactured through exactly the same procedure as that in Example 1 except that a conductive layer was formed by applying molybdenum (Mo) paste onto one base material of sintered aluminum nitride.

Temperature distribution on the surface of the silicon wafer measured by the same method as that in Example 1 was ±0.4° C. Similarly to the process in Example 1, a process of depositing a film was performed for 100 hours and no clogging occurred in through holes. It took 6 minutes for the gas shower unit temperature to rise from room temperature to 600° C. and took 10 minutes to fall from 600° C. to room temperature after supply of power was stopped.

EXAMPLE 24

Two base materials of sintered aluminum nitride were produced by the same manufacturing method as that in Example 1. A gas shower unit was manufactured by exactly the same method as that in Example 1 except that paste of silver-palladium (Ag-Pd) was applied to one base material of sintered aluminum nitride so as to form a conductive layer.

Temperature distribution on the surface of the silicon wafer measured by the same method as that in Example 1 was ±0.4° C. Similarly to the process in Example 1, a process of depositing a film was performed for 100 hours and no clogging occurred in through holes. It took 6 minutes for the gas shower unit temperature to rise from room temperature to 600° C. and took 10 minutes to fall from 600° C. to room temperature after supply of power was stopped.

EXAMPLE 25

Two base materials of sintered aluminum nitride were produced by the same method as that in Example 1. A gas shower unit was manufactured by exactly the same method as that in Example 1 except that paste of nickel-chromium (Ni-Cr) was applied to one base material of sintered aluminum nitride so as to form a conductive layer.

Temperature distribution on the surface of the silicon wafer measured by the same method as that in Example 1 was ±0.4° C. Similarly to the process in Example 1, a process of depositing a film was performed for 100 hours and no clogging occurred in through holes. It took 6 minutes for the gas shower unit temperature to rise from room temperature to 600° C. and took 10 minutes to fall from 600° C. to room temperature after supply of power was stopped.

EXAMPLES 26 TO 30

By the same manufacturing method as that in Example 1, one base material of sintered aluminum nitride and another base material of sintered aluminum nitride having a tungsten conductive layer formed thereon were produced. The two sintered materials were joined in nitrogen gas at 700° C. using glass of respective thermal expansion coefficients $2.5 \times 10^{-6}$/°C., $3 \times 10^{-6}$/°C., $5 \times 10^{-6}$/°C., $7.9 \times 10^{-6}$/°C. and $10 \times 10^{-6}$/°C. for respective examples. The target temperature increasing rate was 30 minutes/600° C. or less. Crack after 35 minutes, crack after 6 minutes, no crack within 6 minutes, crack after 8 minutes, and crack after 80 minutes were observed in respective examples.

COMPARATIVE EXAMPLE 1

Figure 13:
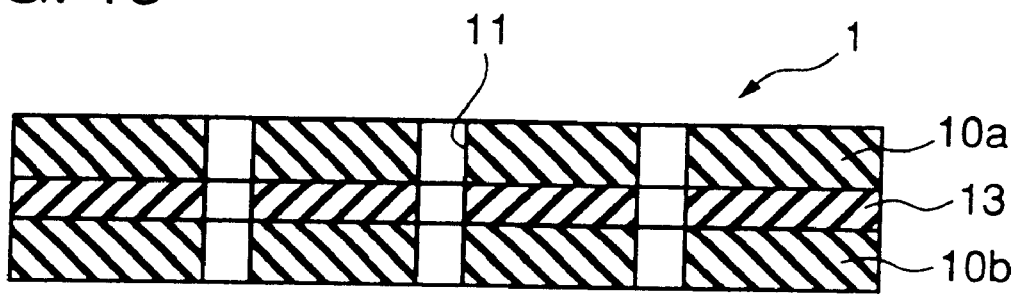
FIG. 13 illustrates a cross section of a gas shower unit as an example for comparison with the present invention.

Two base materials of sintered aluminum nitride having through holes were produced by the same method as that in Example 1. Glass powder was applied by printing onto one surface of one of the base materials of sintered aluminum nitride. After the one surface of the sintered aluminum nitride base material was degreased at 500° C., another sintered aluminum nitride base material was overlaid thereon. The base materials were fixed by a jig made of molybdenum, a weight was placed thereon, and they were joined in nitrogen gas at 650° C. A gas shower unit 1 as shown in FIG. 13 was accordingly manufactured. Glass layer 13 as shown in FIG. 13 joined sintered aluminum nitride base materials 10a and 10b. A plurality of through holes 11 were made in gas shower unit 1.

Gas shower unit 1 thus produced was incorporated into the CVD apparatus as shown in FIG. 1. A silicon wafer 3 of 300 mm in diameter was mounted on the surface of wafer holder 2 and heated to 700° C. Reactant gas was then allowed to pass through holes 11 of gas shower unit 1 to be supplied onto the surface of silicon wafer 3. Temperature distribution on the surface of silicon wafer 3 in this state measured by a radiation thermometer was ±15° C. Further, a process was conducted for 100 hours in which a titanium nitride film was deposited on the surface of silicon wafer 3. In this period, there was no film observed which adhered on the surface of the base material of gas shower unit 1 and in through holes 11, and no clogging was found in through holes.

The temperature of gas shower unit 1 was gradually increased by the heat radiated from underlying wafer holder 2, and it took 180 minutes for the temperature to reach 600° C. When supply of power to wafer holder 2 was stopped, the temperature of gas shower unit 1 fell to room temperature in 15 minutes.

COMPARATIVE EXAMPLE 2

Figure 14:
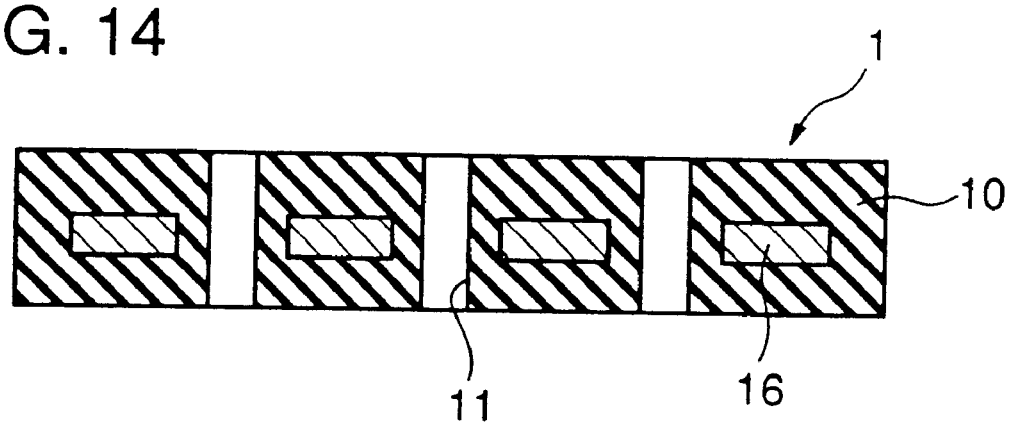
FIG. 14 illustrates a cross section of a gas shower unit as another example for comparison with the present invention.

5% by mass of Yttria ($Y_2O_3$) as sintering agent and binder were added to aluminum nitride powder. They were dispersively mixed and the resultant mixture was press-formed by using a mold such that it would have an outer diameter of 350 mm and a thickness of 5 mm after sintered. In this way, two compact pieces of aluminum nitride were produced. Between these two aluminum nitride compact pieces, a molybdenum wire of 0.5 mm in diameter was arranged in a spiral shape at a pitch of 10 mm such that the outer diameter of coil winding was 5 mm. In this state, they were hot-press sintered at 1850° C. After sintering, through holes each having a diameter of 0.5 mm were formed one by one in the resultant base material of sintered aluminum nitride by using a micro diamond drill, the through holes being formed to avoid the region where the heater coil was arranged. 50 through holes were produced in the base material of sintered aluminum nitride accordingly. A gas shower unit 1 having a heater coil wire 16 in sintered aluminum nitride base material 10 was manufactured as shown in FIG. 14.

Gas shower unit 1 accordingly manufactured was incorporated into the CVD apparatus as shown in FIG. 1. A silicon wafer 3 of 300 mm in diameter was mounted on wafer holder 2 and heated to 700° C. On the other hand, 200 V was applied to heater coil wire 16 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±10° C. Further, a process was conducted for 8 hours in which a titanium nitride film was deposited on the surface of silicon wafer 3. In this period, films adhered on the surface of the base material of gas shower unit 1 and in through holes and clogging occurred in through holes. Further, particles were generated on the surface of silicon wafer 3, and cleaning became necessary for gas shower unit 1. After this, power supply to heater coil wire 16 was stopped, and the temperature of gas shower unit 1 fell from 600° C. to room temperature in 180 minutes. When voltage of 200 V was applied as power supply to heater coil wire 16, the temperature of gas shower unit 1 rose from room temperature to 600° C. in 30 minutes.

COMPARATIVE EXAMPLE 3

Six base materials of sintered aluminum nitride having through holes formed therein were produced by the same method as that in Example 1. On one of the sintered aluminum nitride base materials, a conductive layer of tungsten was formed by the same method as that in Example 1. The six sintered materials were joined with glass layers interposed therebetween according to the same method as that in Example 1.

Gas shower unit 1 thus obtained was incorporated into the CVD apparatus shown in FIG. 1. A silicon wafer 3 of 300 mm in diameter was mounted on wafer holder 2 and heated to 700° C. On the other hand, 200 V was applied to a heater circuit patter 12 of gas shower unit 1 to heat gas shower unit 1 to 600° C. Then, reactant gas was allowed to pass through holes 11 to be supplied onto the surface of silicon wafer 3. Temperature distribution on the surface of silicon wafer 3 measured by a radiation thermometer was ±0.8° C. Further, a process was conducted for 14 hours in which a titanium nitride (TiN) film was deposited on the surface of silicon wafer 3 by using a predetermined reactant gas. In this period, films adhered on the surface of the base material of gas shower unit 1 and in through holes and clogging occurred in through holes. Further, particles were generated on the surface of silicon wafer 3, and cleaning became necessary for gas shower unit 1. After this, power supply to heater circuit pattern 12 was stopped, and the temperature of gas shower unit 1 fell from 600° C. to room temperature in 30 minutes. When voltage of 200 V was applied as power supply to heater circuit pattern 12, the temperature of gas shower unit 1 rose from room temperature to 600° C. in 15 minutes.

The structures of gas shower units according to Examples 1 to 30 and Comparative Examples 1 to 3 as well as respective results are shown in Table 1. It is noted that, in Table 1, "W posmeta" means that the conductive layer containing tungsten is produced by the post metalizing method, "W co-fire" means that the conductive layer containing tungsten is produced by the co-fire method, and "Mo coil/HP" means that a sintered base material is produced through hot-press sintering with a molybdenum coil wire interposed between compact pieces.

TABLE 1

| | | | Structure | | | | Result |
|---|---|---|---|---|---|---|---|
| | | Conductive Layer | Through Hole Density (holes/cm$^2$) | Apparatus | Base Material Thickness (mm) | Joint or Protective Layer Thermal Expansion Coefficient (×10$^{-6}$/° C.) | Wafer Temp Distribution (±° C.) |
| Example | 1 | W Posmeta | 0.7 | CVD | 2 | 5 | 0.4 |
| | 2 | W Posmeta | 0.14 | CVD | 2 | 5 | 4.0 |
| | 3 | W Posmeta | 0.7 | Plasma CVD | 3 | 5 | 0.5 |
| | 4 | W Co-fire | 0.7 | CVD | 2 | 5 | 0.5 |
| | 5–17 | W Posmeta | 0.7 | CVD | 2 | Nonoxide 3–6 | 0.5 |

TABLE 1-continued

|  |  | Structure | | | | Result |
|---|---|---|---|---|---|---|
|  |  | Conductive Layer | Through Hole Density (holes/cm$^2$) | Apparatus | Base Material Thickness (mm) | Joint or Protective Layer Thermal Expansion Coefficient (×10$^{-6}$/° C.) | Wafer Temp Distribution (±° C.) |
|  | 18 | W Posmeta | 0.7 | CVD | Si$_3$N$_4$:2 | 5 | 2.0 |
|  | 19 | W Posmeta | 0.7 | CVD | AlON:2 | 5 | 3.0 |
|  | 20 | W Posmeta | 0.7 | CVD | 1 | AlN:4.5 | 0.4 |
|  | 21 | W Posmeta | 0.7 | CVD | 5 | 5 | 0.6 |
|  | 22 | W Posmeta | 0.05 | CVD | 2 | 5 | 7.0 |
|  | 23 | Mo | 0.7 | CVD | 2 | 5 | 0.4 |
|  | 24 | Ag—Pd | 0.7 | CVD | 2 | 5 | 0.4 |
|  | 25 | Ni—Cr | 0.7 | CVD | 2 | 5 | 0.4 |
|  | 26 | W Posmeta | 0.7 | CVD | 2 | 2.5 | — |
|  | 27 | W Posmeta | 0.7 | CVD | 2 | 3 | — |
|  | 28 | W Posmeta | 0.7 | CVD | 2 | 5 | — |
|  | 29 | W Posmeta | 0.7 | CVD | 2 | 7.9 | — |
|  | 30 | W Posmeta | 0.7 | CVD | 2 | 10 | — |
| Comp. Example | 1 | No Heater | 0.7 | CVD | 2 | 5 | 15.0 |
|  | 2 | Mo Coil/HP | 0.07 | CVD | 10 | — | 10.0 |
|  | 3 | W Posmeta | 0.7 | CVD | 6 | 5 | 0.8 |

TABLE 2

| Example | Joint Layer | Joint Temp |
|---|---|---|
| 5 | 40% AlN + 60% (Ca—Al—Si—O) | 1600° C. |
| 6 | 50% AlN + 50% (Ca—Al—Si—O) | 1600° C. |
| 7 | 70% AlN + 30% (Ca—Al—Si—O) | 1600° C. |
| 8 | 90% AlN + 10% (Y—Ca—O) | 1650° C. |
| 9 | 90% AlN + 10% (Yb—Nd—Ca—O) | 1650° C. |
| 10 | 90% AlN + 10% (Yb—Nd—Ca—O) | 1650° C. |
| 11 | 97% AlN + 3% (Yb—Nd—Ca—O) | 1650° C. |
| 12 | 40% Si$_3$N$_4$ + 60% (Ca—Al—Si—O) | 1600° C. |
| 13 | 50% Si$_3$N$_4$ + 50% (Ca—Al—Si—O) | 1600° C. |
| 14 | 70% Si$_3$N$_4$ + 30% (Y—Al—Mg—O) | 1600° C. |
| 15 | 90% Si$_3$N$_4$ + 10% (Y—Al—Mg—O) | 1650° C. |
| 16 | 90% AlN + 10% (Y—Al—Mg—O) | 1650° C. |
| 17 | Yb—Nd—Ca—O | 1650° C. |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A gas shower unit for a semiconductor manufacturing apparatus, said gas shower unit including a gas introduction chamber and a gas shower plate that has a first side which faces and bounds said gas introduction chamber and a second side opposite said first side which is adapted to face and bound a process chamber of the apparatus, wherein said gas shower plate has a total thickness of at most 5 mm between said first side and said second side, and wherein said gas shower plate comprises:

a sintered ceramics base material composed of a sintered ceramic and having a thickness of at most 5 mm and a plurality of through holes passing therethrough and entirely through said gas shower plate from said first side to said second side; and an electrically conductive layer formed directly on or directly in said sintered ceramics base material.

2. The gas shower unit for a semiconductor manufacturing apparatus according to claim 1, wherein said electrically conductive layer forms a heater circuit pattern.

3. The gas shower unit for a semiconductor manufacturing apparatus according to claim 1, wherein said electrically conductive layer forms a plasma-generating electrode.

4. The gas shower unit for a semiconductor manufacturing apparatus according to claim 1, wherein said sintered ceramics base material has said through holes of at least 0.1 in number per square centimeter and of at least 0.01 mm in diameter.

5. The gas shower unit for a semiconductor manufacturing apparatus according to claim 4, wherein said sintered ceramics base material has said through holes of at least 0.5 in number per square centimeter and of at least 0.01 mm in diameter.

6. The gas shower unit for a semiconductor manufacturing apparatus according to claim 1, wherein said sintered ceramic includes one ceramic selected from the group consisting of aluminum nitride, aluminum oxide, silicon nitride and aluminum oxynitride.

7. The gas shower unit for a semiconductor manufacturing apparatus according to claim 6, wherein said sintered ceramic is aluminum nitride.

8. The gas shower unit for a semiconductor manufacturing apparatus according to claim 1, wherein said sintered ceramics base material includes a first sintered ceramics piece and a second sintered ceramics piece, said conductive layer is formed on a surface of said first sintered ceramics piece, and said gas shower unit further includes a joint layer interposed between the surface of said first sintered ceramics piece on which said conductive layer is formed and said second sintered ceramics piece for connecting said first sintered ceramics piece and said second sintered ceramics piece.

9. The gas shower unit for a semiconductor manufacturing apparatus according to claim 8, wherein said joint layer includes glass.

10. The gas shower unit for a semiconductor manufacturing apparatus according to claim 9, wherein said joint layer is a glass layer having a thermal expansion coefficient of at least 3.0×10$^{-6}$/°C. and at most 8.0×10$^{-6}$/°C.

11. The gas shower unit for a semiconductor manufacturing apparatus according to claim 8, wherein said joint layer includes nonoxide ceramics.

12. The gas shower unit for a semiconductor manufacturing apparatus according to claim 11, wherein
said joint layer includes nonoxide ceramics having a thermal expansion coefficient of at least $3.0\times10^{-6}$/°C. and at most $6.0\times10^{-6}$/°C.

13. The gas shower unit for a semiconductor manufacturing apparatus according to claim 11, wherein
said nonoxide ceramics includes at least 50% by mass of either aluminum nitride or silicon nitride.

14. The gas shower unit for a semiconductor manufacturing apparatus according to claim 8, wherein
said joint layer includes oxide containing ytterbium, neodymium and calcium or includes a compound generating oxide containing ytterbium, neodymium and calcium by being heated.

15. The gas shower unit for a semiconductor manufacturing apparatus according to claim 8, wherein
said joint layer includes oxide containing yttrium and aluminum or includes a compound generating oxide containing yttrium and aluminum by being heated.

16. The gas shower unit for a semiconductor manufacturing apparatus according to claim 1, wherein
said conductive layer is formed on one surface or both surfaces of said sintered ceramics base material, and a protective layer is formed to cover a surface of said conductive layer.

17. The gas shower unit for a semiconductor manufacturing apparatus according to claim 16, wherein
said protective layer includes glass.

18. The gas shower unit for a semiconductor manufacturing apparatus according to claim 17, wherein
said protective layer is a glass layer having a thermal expansion coefficient of at least $3.0\times10^{-6}$/°C. and at most $8.0\times10^{-6}$/°C.

19. The gas shower unit for a semiconductor manufacturing apparatus according to claim 16, wherein
said protective layer includes nonoxide ceramics.

20. The gas shower unit for a semiconductor manufacturing apparatus according to claim 19, wherein
said protective layer includes nonoxide ceramics having a thermal expansion coefficient of at least $3.0\times10^{-6}$/°C. and at most $6.0\times10^{-6}$/°C.

21. The gas shower unit for a semiconductor manufacturing apparatus according to claim 19, wherein
said nonoxide ceramics includes at least 50% by mass of either aluminum nitride or silicon nitride.

22. The gas shower unit for a semiconductor manufacturing apparatus according to claim 1, wherein
said conductive layer includes at least one element selected from the group consisting of tungsten, molybdenum, silver, palladium, platinum, nickel and chromium.

23. The gas shower unit for a semiconductor manufacturing apparatus according to claim 1, wherein
said conductive layer is formed along a plane in said sintered ceramics base material, and
said gas shower unit further includes an external connection terminal that is formed along said plane and that connects to said conductive layer and is exposed from said sintered ceramics base material.

24. The gas shower unit for a semiconductor manufacturing apparatus according to claim 1, further comprising a temperature detection unit included in said sintered ceramics base material.

25. A semiconductor manufacturing apparatus including therein the gas shower unit according to claim 1.

26. The semiconductor manufacturing apparatus according to claim 25, the semiconductor manufacturing apparatus being one selected from the group consisting of etching apparatus, CVD apparatus and plasma CVD apparatus.

27. A semiconductor manufacturing apparatus comprising a process chamber and a gas shower unit arranged and adapted to supply a process gas into said process chamber, wherein:
said gas shower unit comprises a gas introduction chamber and a gas shower plate that separates said gas introduction chamber from said process chamber;
said gas shower plate has a first side bounding said gas introduction chamber and a second- side bounding said process chamber, a plurality of through-holes passing through said gas shower plate from said first side to said second side, and a total thickness of at most 5 mm between said first side and said second side;
said gas shower plate comprises a first sintered ceramic layer and a first electrically conductive layer that is formed directly on or embedded within said first sintered ceramic layer;
said first electrically conductive layer is embedded within said gas shower plate between said first side and said second side so that said first electrically conductive layer is displaced away from and between said first side and said second side.

28. The semiconductor manufacturing apparatus according to claim 27, wherein said gas shower plate further comprises a second sintered ceramic layer, and a first joint layer comprising a glass or a non-oxide ceramic, wherein said first electrically conductive layer is formed directly on said first sintered ceramic layer and said first joint layer is interposed between said second sintered ceramic layer on one side of said first joint layer, and said first sintered ceramic layer as well as said electrically conductive layer on another side of said first joint layer.

29. The semiconductor manufacturing apparatus according to claim 28, wherein said gas shower plate consists of said first sintered ceramic layer, said first electrically conductive layer, said joint layer and said second sintered ceramic layer.

30. The semiconductor manufacturing apparatus according to claim 28, wherein said gas shower plate further comprises a second electrically conductive layer, a second joint layer, and a third sintered ceramic layer, wherein said second electrically conductive layer and said second joint layer are interposed between said first sintered ceramic layer and said third sintered ceramic layer.

31. The semiconductor manufacturing apparatus according to claim 27, wherein said first electrically conductive layer is embedded within said first sintered ceramic layer, which is integrally sintered with said first electrically conductive layer therein.

32. The semiconductor manufacturing apparatus according to claim 31, wherein said gas shower plate consists of said first sintered ceramic layer and said first electrically conductive layer embedded therein.

33. The semiconductor manufacturing apparatus according to claim 27, wherein said first electrically conductive layer is formed directly on said first sintered ceramic layer, and wherein said gas shower plate further comprises a first protective cover layer that comprises a glass or a non-oxide ceramic and that covers said first electrically conductive layer on said first ceramic layer.

34. The semiconductor manufacturing apparatus according to claim 33, wherein said gas shower plate consists of said first sintered ceramic layer, said first electrically conductive layer and said first protective cover layer.

35. The semiconductor manufacturing apparatus according to claim 33, wherein said gas shower plate further comprises a second electrically conductive layer formed directly on said first sintered ceramic layer on a side thereof opposite said first electrically conductive layer, and a second protective cover layer that comprises a glass or a non-oxide ceramic and that covers said second electrically conductive layer on said first ceramic layer.

36. The semiconductor manufacturing apparatus according to claim 27, wherein said first electrically conductive layer is a meandering patterned electrical heater.

37. The semiconductor manufacturing apparatus according to claim 36, wherein said gas shower plate further comprises a second electrically conductive layer arranged on a side of said first sintered ceramic layer opposite said first electrically conductive layer, and wherein said second electrically conductive layer is a continuous layer forming an electrode for plasma generation.

* * * * *